United States Patent [19]
Weiss et al.

[11] Patent Number: 5,830,596
[45] Date of Patent: Nov. 3, 1998

[54] METHOD FOR PRODUCING BATTERY TESTER LABEL AND RESULTING LABEL AND BATTERY ASSEMBLY

[75] Inventors: Victor H. Weiss; John G. Langbehn, both of Minnetonka; Jeffrey L. Anderson, Excelsior; Dean A. Laird, Shakopee, all of Minn.

[73] Assignee: Morgan Adhesives, Inc., Stow, Ohio

[21] Appl. No.: 634,071

[22] Filed: Apr. 17, 1996

Related U.S. Application Data

[63] Continuation-in-part of Ser. No. 426,367, Apr. 21, 1995, Pat. No. 5,626,978, which is a continuation of Ser. No. 56,054, May 3, 1993, Pat. No. 5,409,788, and a continuation of Ser. No. 377,178, Jan. 24, 1995, Pat. No. 5,538,806, said Ser. No. 377,178, is a continuation of Ser. No. 56,160, May 3, 1993, Pat. No. 5,393,618, and a continuation of Ser. No. 377,352, Jan. 24, 1995, Pat. No. 5,604,049, said Ser. No. 377,352, is a continuation of Ser. No. 56,058, May 3, 1993, Pat. No. 5,389,458.

[51] Int. Cl.⁶ ........................................ H01M 2/02
[52] U.S. Cl. ................................ 429/93; 429/90; 324/425
[58] Field of Search .................................. 429/90, 91, 92, 429/93; 324/427, 345, 425; 29/623.1

[56] References Cited

U.S. PATENT DOCUMENTS

| | | |
|---|---|---|
| 394,100 | 12/1888 | Currie . |
| 945,564 | 1/1910 | Marko . |
| 1,497,388 | 6/1924 | Sterling . |
| 2,980,754 | 4/1961 | Reilly et al. . |
| 2,988,590 | 6/1961 | Andre . |
| 3,280,701 | 10/1966 | Donnelly et al. . |
| 3,500,372 | 3/1970 | Thiele . |
| 3,514,338 | 5/1970 | Korneliske Shakour Nee Eekma . |
| 3,563,806 | 2/1971 | Hruden . |
| 3,667,039 | 5/1972 | Garfein et al. . |
| 3,720,869 | 3/1973 | Rowlette . |
| 3,764,893 | 10/1973 | Weigand . |
| 3,773,563 | 11/1973 | Eaton, Jr. et al. . |
| 3,823,367 | 7/1974 | Kaye et al. . |
| 4,006,414 | 2/1977 | Parker . |
| 4,027,231 | 5/1977 | Lohrmann . |
| 4,060,666 | 11/1977 | Anes . |

(List continued on next page.)

FOREIGN PATENT DOCUMENTS

| | | |
|---|---|---|
| 0450938A2 | 10/1991 | European Pat. Off. . |
| 0450938A3 | 10/1991 | European Pat. Off. . |
| 0495636A2 | 7/1992 | European Pat. Off. . |
| 0495636A3 | 7/1992 | European Pat. Off. . |
| 0497616A2 | 8/1992 | European Pat. Off. . |
| 0501609A1 | 9/1992 | European Pat. Off. . |
| 923008452 | 10/1992 | European Pat. Off. . |
| 0523901A1 | 1/1993 | European Pat. Off. . |
| 923003198 | 2/1994 | European Pat. Off. . |
| 943031294 | 9/1994 | European Pat. Off. . |
| 943031344 | 9/1994 | European Pat. Off. . |
| 943030858 | 10/1994 | European Pat. Off. . |

(List continued on next page.)

OTHER PUBLICATIONS

Parker, Robert, *Solid State RMS Recording Ammeter*, Lawrence Livermore Laboratory, University of California (1972) (Month N/A).

Batcheck Advertisement/Instructions by Celgard, 13800 S. Lakes Dr., Charlotte, NC Jun. 1988.

*Primary Examiner*—M. Nuzzolillo
*Attorney, Agent, or Firm*—Robert W. Welsh

[57] ABSTRACT

A method for producing a battery tester label is disclosed. The method includes forming an inserted tester device and a base layer, which are combined together to form the battery tester label. The resulting tester label can be applied to a battery. Also disclosed are methods for producing a plurality of battery tester labels disposed on a common releasable liner. The resulting array can be stored for subsequent application to batteries, cut into relatively long strips for rolling and storage, or immediately applied to batteries.

32 Claims, 5 Drawing Sheets

U.S. PATENT DOCUMENTS

| | | |
|---|---|---|
| 4,118,112 | 10/1978 | Thornburg . |
| 4,173,733 | 11/1979 | Sugalski et al. . |
| 4,198,597 | 4/1980 | Sawyer . |
| 4,248,942 | 2/1981 | Eby et al. . |
| 4,316,185 | 2/1982 | Watrous et al. . |
| 4,360,780 | 11/1982 | Skutch, Jr. . |
| 4,365,241 | 12/1982 | Morishita . |
| 4,371,827 | 2/1983 | Mullersman et al. . |
| 4,379,816 | 4/1983 | Mullersman et al. . |
| 4,392,102 | 7/1983 | Sugalski et al. . |
| 4,421,560 | 12/1983 | Kito et al. . |
| 4,432,041 | 2/1984 | Pfisterer et al. . |
| 4,497,881 | 2/1985 | Bertolino . |
| 4,520,353 | 5/1985 | McAuliffe . |
| 4,536,757 | 8/1985 | Ijntema . |
| 4,560,937 | 12/1985 | Finger . |
| 4,626,765 | 12/1986 | Tanaka . |
| 4,680,527 | 7/1987 | Benenati et al. . |
| 4,702,563 | 10/1987 | Parker . |
| 4,702,564 | 10/1987 | Parker . |
| 4,723,656 | 2/1988 | Kiernan et al. . |
| 4,726,661 | 2/1988 | Parker . |
| 4,727,006 | 2/1988 | Malinowski et al. . |
| 4,737,020 | 4/1988 | Parker . |
| 4,746,200 | 5/1988 | Kamigaki . |
| 4,801,514 | 1/1989 | Will et al. . |
| 4,835,475 | 5/1989 | Hanakura et al. . |
| 4,835,476 | 5/1989 | Kurosawa . |
| 4,876,632 | 10/1989 | Osterhout et al. . |
| 4,902,108 | 2/1990 | Byker . |
| 4,911,994 | 3/1990 | Will et al. . |
| 4,917,973 | 4/1990 | Yoshimoto et al. . |
| 5,015,544 | 5/1991 | Burroughs et al. . |
| 5,059,895 | 10/1991 | Cataldi et al. . |
| 5,128,616 | 7/1992 | Palmer . |
| 5,130,658 | 7/1992 | Bohmer . |
| 5,132,176 | 7/1992 | Valentine et al. . |
| 5,156,931 | 10/1992 | Burroughs et al. . |
| 5,188,231 | 2/1993 | Kivell et al. . |
| 5,223,003 | 6/1993 | Tucholski et al. . |
| 5,231,356 | 7/1993 | Parker . |
| 5,250,905 | 10/1993 | Kuo et al. . |
| 5,389,458 | 2/1995 | Weiss et al. . |
| 5,393,618 | 2/1995 | Weiss et al. . |
| 5,409,788 | 4/1995 | Weiss et al. . |
| 5,604,049 | 2/1997 | Weiss et al. ............................ 429/93 |
| 5,626,978 | 5/1997 | Weiss et al. ............................ 429/93 |

FOREIGN PATENT DOCUMENTS

| | | |
|---|---|---|
| 57-153275 | 9/1982 | Japan . |
| 58-169768A | 10/1983 | Japan . |
| 60-66170 | 4/1985 | Japan . |
| 830174598 | 4/1985 | Japan . |
| 53-128586 | 11/1985 | Japan . |
| 63-179269 | 7/1988 | Japan . |
| 63-213256 | 9/1988 | Japan . |
| 241365 | 3/1990 | Japan . |
| 2100269 | 4/1990 | Japan . |
| 2184884A | 7/1990 | Japan . |
| 313379 | 1/1991 | Japan . |
| 3123384A | 5/1991 | Japan . |
| 4329384A | 11/1992 | Japan . |
| 4329385A | 11/1992 | Japan . |
| 1153226 | 5/1969 | United Kingdom . |
| 2011698 | 7/1979 | United Kingdom . |
| 2282697 | 4/1995 | United Kingdom . |
| WO9213368 | 3/1991 | WIPO . |
| WO9203852 | 3/1992 | WIPO . |
| WO9306474 | 4/1993 | WIPO . |

METHOD FOR PRODUCING BATTERY TESTER LABEL AND RESULTING LABEL AND BATTERY ASSEMBLY

CROSS REFERENCE TO RELATED APPLICATIONS

This is a continuation-in-part of application Ser. No. 08/426,367 filed Apr. 21, 1995, entitled METHOD FOR SECURING A TESTER DEVICE TO A BATTERY AND THE BATTERY SO PRODUCED now U.S. Pat. No. 5,626,978 which is a continuation of Ser. No. 08/056,054 now U.S. Pat. No. 5,409,788 filed May 3, 1993; and a continuation of application Ser. No. 08/377,178 filed Jan. 24, 1995, entitled BATTERY WITH TESTER LABEL AND METHOD FOR PRODUCING IT, now patent 5,538,806, which is a continuation of Ser. No. 08/056/160 now U.S. Pat. No. 5,393,618 filed May 3, 1993; which is a continuation of application Ser. No. 08/377,352 filed Jan. 24, 1995, entitled BATTERY WITH TESTER LABEL AND METHOD FOR PRODUCING IT, now U.S. Pat. No. 5,604,049 which is a continuation of 08/056,058 now U.S. Pat. No. 5,389,458 filed May 3, 1993.

FIELD OF THE INVENTION

The present invention relates to a method for producing a battery tester label and the resulting label and battery assembly. The novel battery tester label is readily formed from two subcomponents which are easily manufactured and which can be stored for subsequent assembly of the tester label. The present invention also relates to processes for producing multiple battery tester labels disposed on a common releasable liner.

BACKGROUND OF THE INVENTION

Batteries are often stored before being used. Batteries are typically stored by retailers before being sold. After purchase by a consumer, such batteries are again typically stored for some period of time prior to use. If the period of storage is significant, batteries may self-discharge. Therefore, it is desirable to utilize a battery tester to determine if a battery has sufficient charge to operate a desired device.

It is also desirable, on frequent occasions, to determine the remaining life of batteries which are in use. Many "good" batteries are discarded simply because the user cannot recall how long they have been used in a particular device, i.e., a camera, tape deck, etc. For similar reasons, batteries often reach a useless or near useless state of discharge when no replacements are readily available. Separate or stand-alone battery testers are known which indicate remaining battery power. However, such testers are easily misplaced and cumbersome to use.

Battery testers have been described that are included in a label secured to a battery. However, such battery testers are intricate and difficult to manufacture, particularly at high rates necessary for large volume production. Thus, there is a need for a battery tester label having a minimal number of components and a process which can be employed in high rate commercial manufacturing operations.

Previously described battery tester labels, such as disclosed in U.S. Pat. No. 5,059,895 to Cataldi et al., require a complex arrangement of the conductive layer and additional conductors to electrically connect and disconnect the layer to and from the battery. Such intricate assemblies are susceptible to numerous problems during assembly and are costly in view of the additional conductive components necessary which must be formed and incorporated into the assembly. Thus, there is a need for a battery tester label which does not require numerous electrically conductive components to connect and disconnect the tester to the battery, and which can be easily and inexpensively manufactured.

In many large-scale manufacturing operations, it is desirable to utilize preassembled components. Such practice minimizes process complexity and as a result often reduces manufacturing downtime. Therefore, it is also desirable to provide a process for forming a battery tester label in which one or more subcomponents of the label assembly can be manufactured, stored and later readily assembled into a tester label. In particular, it is desirable to provide a process for forming a plurality of battery testers which can be easily stored or applied to batteries. The present invention process and resulting assembly, as described and claimed herein, achieve all of the foregoing objectives.

SUMMARY OF THE INVENTION

The present invention provides a method for producing a battery tester label comprising a tester device and a base layer. The process comprises providing a tester device including a conductive circuit defining switch segments on one face of a dielectric substrate and an indicator layer disposed on the other face; providing a base layer comprising a dielectric substrate and thermal insulation disposed on one face of the substrate; forming first and second apertures in the base layer, with at least one raised switch throw pad at one of the apertures; orienting the tester device with the base layer such that the conductive circuit faces the thermal insulation and the switch segments directly overlie the apertures formed in the base layer; and affixing the tester device to the base layer to thereby form the battery tester label of the present invention. The invention also provides the resulting battery tester label, and when applied to a battery, the resulting battery and label assembly. Also provided is a method for producing a plurality of battery tester labels disposed on a common releasable liner. The array of resulting tester labels can be immediately applied to batteries or stored on the liner for shipment or subsequent use.

DESCRIPTION OF THE PREFERRED EMBODIMENTS

The present invention provides a method for preparing a battery tester label and attaching the resulting label to a battery. The preferred embodiment method generally comprises forming two subcomponents, an inserted tester device and a base layer, and combining the inserted tester device with the base layer to produce the battery tester label of the present invention. The resulting label can then be applied to a battery or stored for later attachment.

Figure 1:
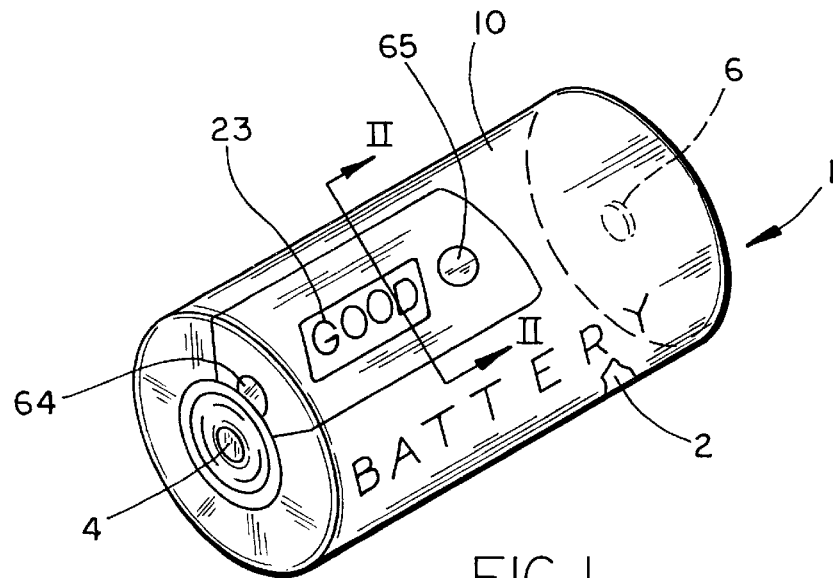
FIG. 1 is an illustration of a battery having a battery tester label in accordance with this invention disposed about the outer periphery of the battery.

FIG. 1 illustrates a battery and label assembly 1 comprising a battery can 2, a negative terminal 4, and a positive terminal 6. Can 2 may be in electrical contact with positive terminal 6. Extending around and attached to the periphery of can 2 is the battery tester label 10 which is the subject of this invention comprising switches 64 and 65 which activate the tester incorporated within label 10 to indicate the state of charge of the battery by exposing indicia 23 or producing some other visual indication.

Figure 5:
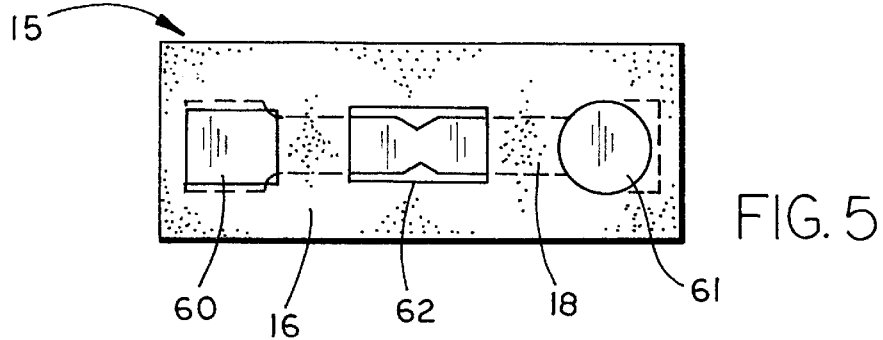
FIG. 5 is a bottom plan view of the inserted tester device, the cross-hatching indicating a layer of adhesive.

The first subcomponent of the preferred embodiment label 10 is an inserted tester device 15, best illustrated in FIGS. 2–5. Tester device 15 generally comprises a laminate or layered assembly having a substrate layer 20, an elongated electrically conductive circuit 18 disposed on a first face of substrate 20, a pressure-sensitive adhesive 16 disposed on portions of both conductive circuit 18 and the first face of substrate 20. Adhesive 16, indicated by cross-hatching in FIG. 5, is preferably applied over conductive layer 18 in the pattern illustrated. It is omitted from those areas which will overlie printed insulation 44 and switch pads 42 when the inserted tester 15 is affixed to base layer 30. This adhesive pattern retards moisture from migrating to the switch pad areas 60 and 61 while not interfering with the function of either the pads or the insulation to be discussed.

Device 15 further comprises one or more graphic layers 22, preferably of decorative ink, and indicia 23 that are disposed on a second face of substrate 20 opposite the face containing the conductive circuit 18. Device 15 also comprises a layer of an indicator material 24 that is deposited upon the second face, preferably upon graphic layers 22 and indicia 23. As described in greater detail below, the indicator material preferably comprises a temperature sensitive indicating material. A layer of a clear protective coating (not shown) is preferably deposited over the indicator layer and optionally upon graphic layers 22 and other exposed regions of the second face of substrate 20.

Figure 2:
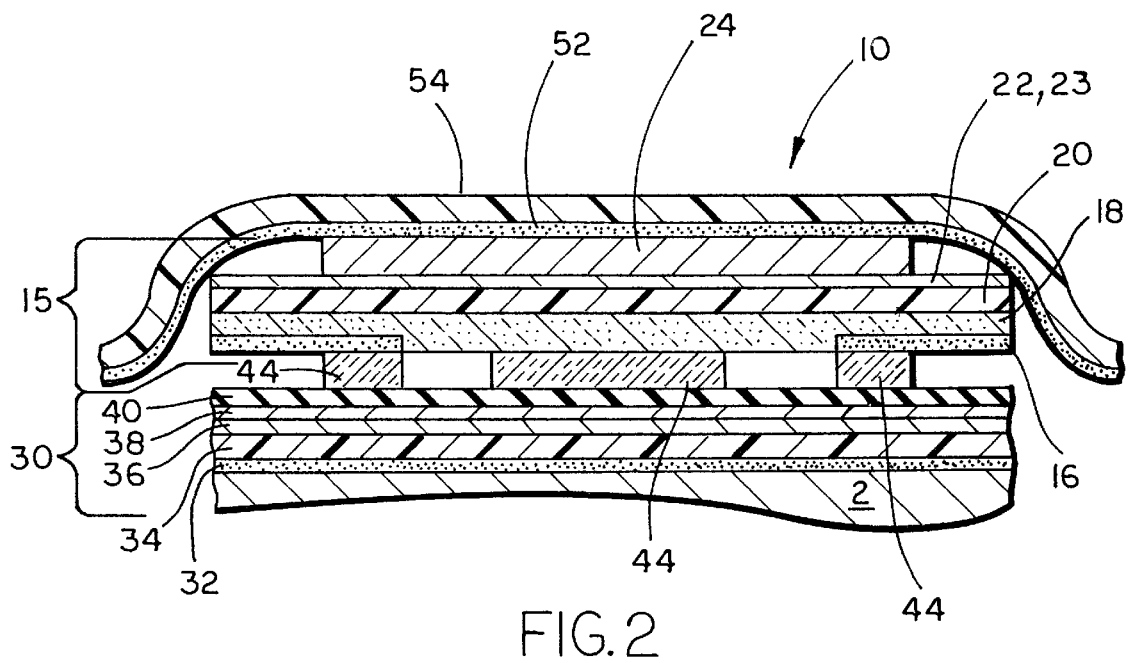
FIG. 2 is a cross section of the battery tester label taken along plane II—II of FIG. 1.
Figure 3:
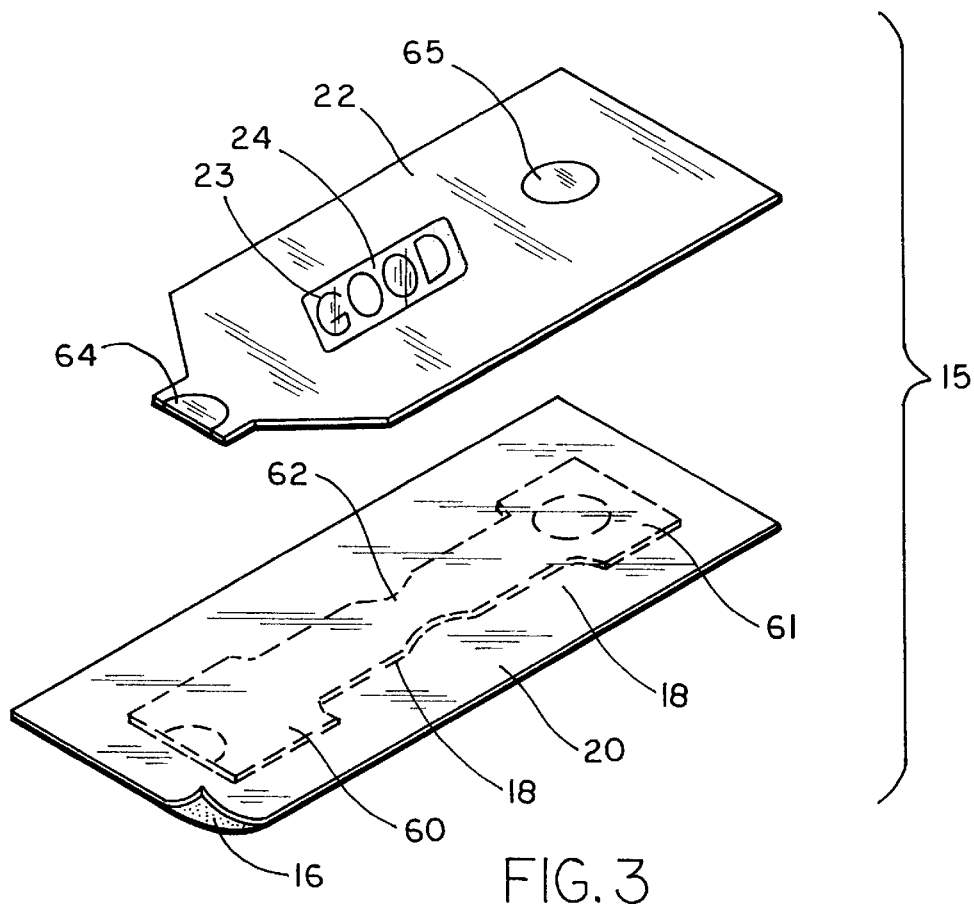
FIG. 3 is an exploded view of a subcomponent of the battery tester label, referred to herein as the inserted tester device.
Figure 4:
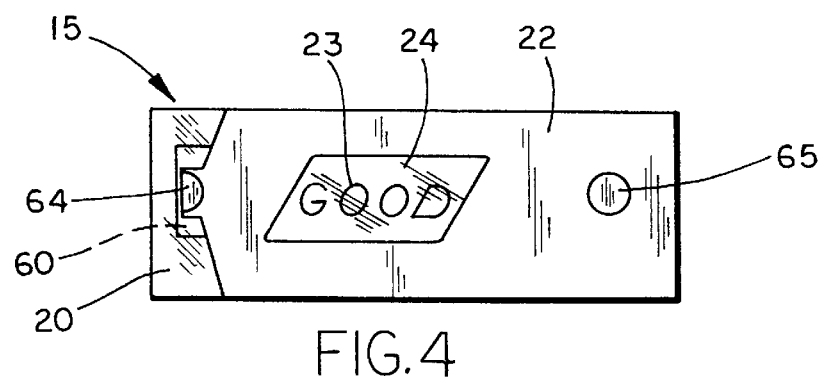
FIG. 4 is a top plan view of the inserted tester device.

The inserted tester device 15, as shown in FIGS. 2–5 and 8, is preferably prepared as follows. A plastic film is provided for substrate 20. Although FIG. 3 illustrates substrate 20 as being transparent, substrate 20 could be formed from a wide variety of other materials including opaque and translucent materials. Conductive circuit 18 is deposited on one face of substrate 20. The conductive circuit is preferably deposited in the form of a pattern comprising two distal regions for forming switches, referred to and illustrated herein as switch segments 60 and 61, and a medially disposed area of controlled resistivity 62 which undergoes an increase in temperature upon passage of electrical current. A pressure-sensitive adhesive material 16 is deposited on at least portions of either or both the conductive circuit 18 and substrate 20 face. As previously noted, particular regions of conductive circuit 18 are left exposed and not covered with pressure-sensitive adhesive 16; namely, the switch segments 60 and 61 and area of controlled resistivity 62. A silicone coated release liner, such as a silicone coated paper or plastic film (not shown), is applied onto the previously deposited pressure-sensitive adhesive 16 to facilitate handling and/or storage of inserted tester device 15.

Graphics and/or other labeling colors 22 in the form of a layer or layers of decorative ink and indicia 23 are printed to the opposite side of substrate 20 from that on which the conductive circuit 18 is positioned. It is preferred that indicia 23 be disposed directly above the area of controlled resistivity 62 of conductive circuit 18 located on the other side of substrate 20. Additional graphics are also preferably printed to designate switch regions 64 and 65. If necessary, one or more curing operations may be performed to cure or partially cure the graphic or coloring layers.

On the same side of the substrate as the graphics and/or labeling colors, a thermochromic ink or other indicator material 24 is deposited onto substrate 20 such that it is situated directly above the area of controlled resistivity 62 of conductive circuit 18 and preferably over indicia 23. A clear protective coating, such as a varnish film, is then applied over and onto the indicator material, and optionally over the remaining regions of this side of substrate 20 to protect such regions from damage by subsequent manufacturing or storage operations. Each of the previously described layers or elements preferably have a thickness of from about 0.00005 inch to about 0.005 inch. The inserted tester device, if necessary, can be cut to an appropriate size.

Figure 6:
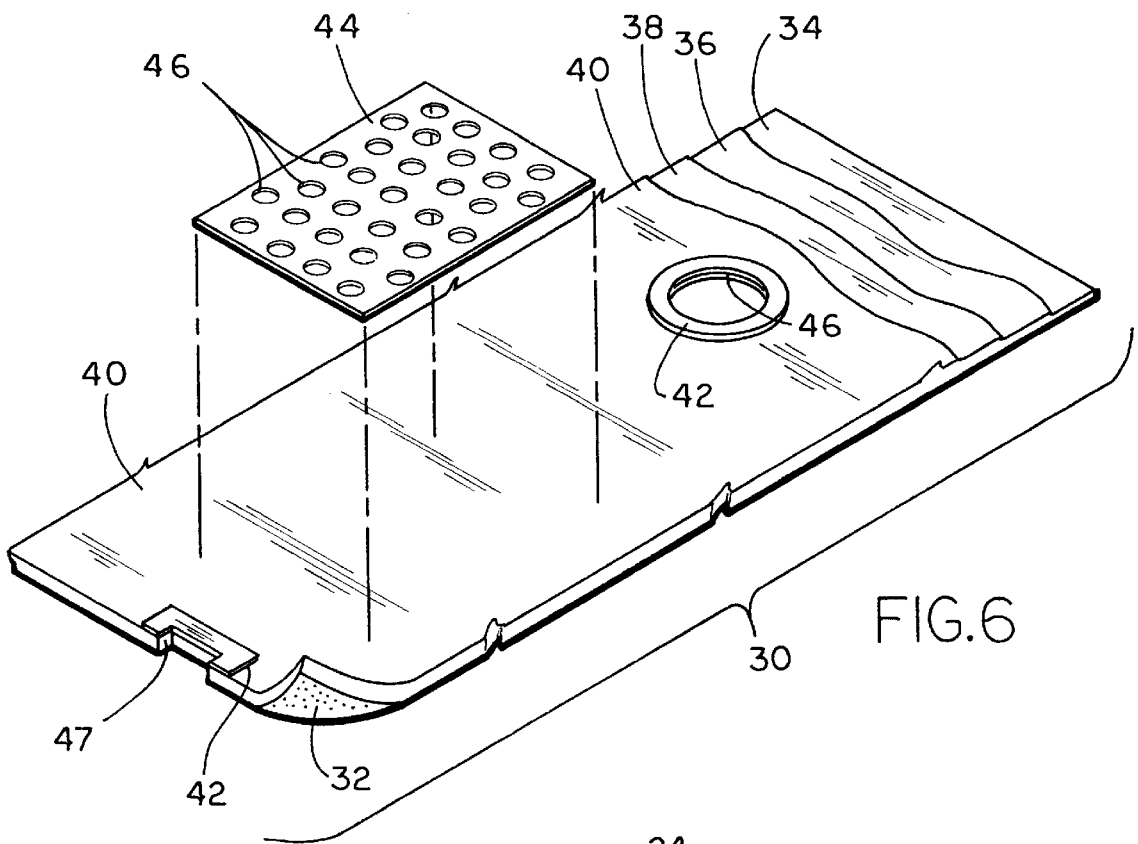
FIG. 6 is an exploded view of another subcomponent of the battery tester label, referred to herein as the base layer.

The second subcomponent of the preferred embodiment label 10 is a base layer 30, best illustrated in FIGS. 2 and 6. Base layer 30 is a laminate or layered structure comprising a substrate 34, with one face having a layer of pressure-sensitive adhesive 32 for subsequent contact with a battery, and another face having one or more layers as follows: a metallization layer 36; a primer and/or decorative layer 38; an electrical insulation layer 40; and a thermal insulation layer 44. Also residing proximate to the thermal insulation layer are one or more switch throw pads 42 described in greater detail below.

Base layer 30 is prepared as follows. A plastic film is provided for the base layer substrate 34. A pressure-sensitive adhesive material 32 is deposited upon the face of the base layer substrate 34 that will subsequently face and contact the battery. A silicone release liner is applied on the pressure-sensitive adhesive to facilitate handling and other processing operations. On the opposite face of base layer substrate 34, one or more graphic or labeling color layers are deposited, for instance, by printing. Preferably, a metallization layer 36 is utilized to provide a decorative reflective layer. If a metallization layer is deposited, it will in most instances be necessary to deposit a receptive coating or primer layer 38 onto those regions of metallization layer 36 upon which other decorative layers are to be deposited. Primer layer 38 may in itself be a decorative layer. It is also desirable to deposit a layer of electrical insulation 40 upon metallization layer 36 and/or primer layer 38 to prevent electrical contact, i.e., shorting, between layer 36 and the conductive circuit 18 of inserted tester device 15 upon assembly of tester label 10.

Thermal insulation 44 is positioned in an area of base layer substrate 34 that will be disposed beneath the indicator material 24 and the maximum resistance area 62 of conductive circuit 18 of the previously described inserted tester device. This thermal insulation reduces heat transfer from the area of controlled resistivity 62 of conductive circuit 18 to the battery. If such heat transfer is not controlled and the battery is permitted to act as a heat sink, the change in temperature at indicator material 24 may be insufficient to provide an accurate indication of the battery state of charge.

Thermal insulation 44, as shown, comprises a plurality of apertures 46 which, when assembled into the laminate structure of the preferred label 10, provide air pockets which further thermally insulate the conductive circuit 18 from the battery. Optionally, a larger region of air space or void may be formed to serve as insulation by depositing a suitable spacer material onto the base layer 30. The preferred insulative pattern is a series of islands printed onto layer 30 in the manner shown in FIG. 1-A of aforenoted U.S. Pat. 5,389,458.

Figure 8:
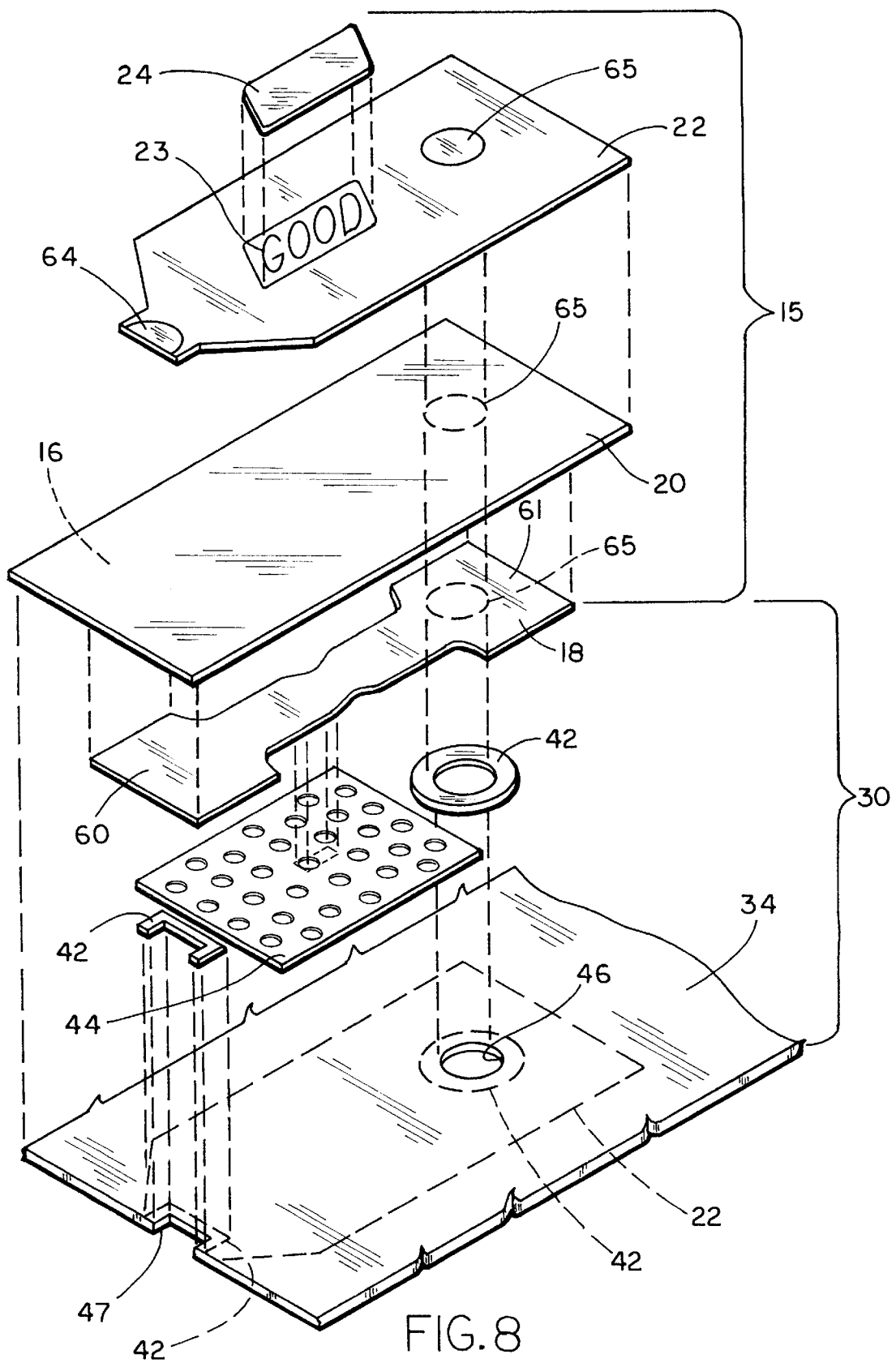
FIG. 8 is an exploded view of the battery tester label.

A switch throw pad 42 is also formed surrounding aperture 46. This raised pad provides spacing between switch segment 61 of the conductive circuit 18 and battery can 2, and significantly minimizes the occurrence of accidental switch closure. Raised switch throw pad 42 is preferably formed by depositing or printing a dielectric ink or other suitable material. A second switch pad 42 may be formed proximate aperture 47 as shown in FIGS. 6 and 8. This pad has not been found necessary to proper functioning of the tester.

In all of the foregoing operations, one or more cure steps may be utilized when depositing or printing any of the previously described layers, particularly the decorative inks. Each of the previously described layers or elements preferably has a thickness from about 0.00005 inch to about 0.005 inch.

Switch apertures 46 and 47 are preferably formed in base layer 30 after printing thermal insulation 44 and switch throw pad 42. Such apertures are preferably formed by suitable punching operations. Registry problems are minimized by printing what is to become switch pad 42 as a solid disk and thereafter punching aperture 46 centrally of this disk. Switch apertures are formed in the base layer 30 so that when the previously described inserted tester device 15 is combined with base layer 30, the switch apertures are located directly beneath the distal switch segments 60 and 61 of conductive circuit 18. The preferred geometry for such switch apertures is a notch 47 for the negative switch segment 64 and a circle 46 for the positive switch segment 65.

The switches utilized in the battery tester label are preferably membrane switches such that a switch segment 60 or 61 of conductive circuit 18 overlies an aperture in the base layer. The aperture in the base layer enables contact between the conductive circuit and a battery terminal on the other side of the base layer. Upon application of a force to a switch segment, such as by applying finger or thumb pressure at 64 or 65, a portion of the switch segment is pressed or deformed through the opening in the base layer to contact the battery terminal. Upon release of the pressure, the portion of the switch segment resiliently "springs" away from and, thus, out of electrical contact with the battery terminal. This configuration is referred to herein as "switchably connected."

A significant advantage provided by the present invention battery tester label is the absence of electrically conductive layers or members to electrically connect and disconnect the tester, i.e., conductive circuit 18, to and from the battery. This is remarkable and of significant benefit particularly when manufacturing a battery tester label in large volumes and at a high rate. This advantage of eliminating otherwise necessary electrically conductive switching components is achieved in part by providing a first switch 64 which is disposed very near a battery terminal, such as negative terminal 4. Such close proximity eliminates the need for additional conductive elements to electrically connect an end of circuit 18 to the negative battery terminal. It is most preferred to fold or shrink the peripheral edge of label 10 over the battery end at which the negative terminal is disposed, as illustrated in FIG. 1. This configuration eliminates the need for a conductive "tab" or member extending outward from the battery, as described in the prior art.

The inserted tester device 15 is combined with the base layer 30 as follows and as best shown in FIG. 8. The inserted tester device is positioned onto or adjacent the base layer so that switch segments 60 and 61 of conductive circuit 18 overlie switch apertures 46 and 47, respectively. The inserted tester device is oriented such that the layer of pressure-sensitive adhesive 16 (the release liner having been removed if previously applied) is facing base layer 30. Upon application of sufficient pressure to the inserted tester device 15 and base layer 30, the two assemblies are securely attached to each other via adhesive 16, and form the preferred battery tester label 10 of the present invention. Optionally, a clear laminating adhesive 52 is deposited upon the outward facing surface of the resulting tester label as illustrated in FIG. 2, and a clear film 54, such as polyvinyl chloride or polyester, is applied over the coating and the resulting assembly cured. A coating of adhesive 52 and film 54, when applied onto the tester label, provide protection for the tester device and components thereof. It is most preferred that the transparent protective layer resulting from adhesive coating 52 and film 54 is deposited upon the battery tester label prior to application of the tester label to a battery.

The resulting battery tester label 10 is appropriately die cut to the size of the battery desired. Upon removal of excess trimmed label, a plurality of individual tester labels are left remaining on the release liner previously applied to substrate 34 of base layer 30. The liner and label array may then be cut into strips and wound into a roll and stored for subsequent application to batteries.

The substrate layer utilized for either or both the base layer substrate 34 and the inserted tester device substrate 20 can be made of any desired dielectric polymer material. It is preferable to use a dielectric polymer material that will shrink when assembled on a battery. Generally, polyvinyl resins, polyolefin resins, polyester resins and the like would be suitable. Specific examples include polyvinyl chloride, polyethylene and polypropylene. It is contemplated that substrate 20 could also be formed from other dielectric materials besides plastics such as paper or other cellulose-based materials. The thickness of the substrate layers is not particularly limited, but is preferably in the range of from about 0.0005 to about 0.005 inch, and most preferably from about 0.001 to about 0.003 inch.

The electrically conductive circuit 18 of the inserted tester device 15 can be a metallic foil, such as silver, nickel, iron, copper, lead, etc., and mixtures thereof, or a metallized plastic layer. The conductive circuit is preferably formed from a silver-based material. Other examples include electrically conductive polymers, paints or inks, such as those that contain graphite, carbon or metal, such as silver or combinations thereof, which can be applied onto a substrate as a conductive layer. Hot stamping of conductive material onto the substrate could also be used. Preferably, conductive circuit 18 is formed as a separate part, most preferably on dielectric substrate 20 and shaped to have first and second switch segments 60 and 61 that are connected to each other via the area of controlled resistivity 62. The resistance in the area of controlled resistivity 62 can vary, to provide a qualitative measure of the remaining battery strength, or it can be constant depending upon the particular application. In the preferred embodiment illustrated, it is generally constant, providing for a "good-bad" indication of remaining battery strength.

The previously described indicator layer 24 in the inserted tester device 15 comprises a thermally sensitive material for indicating the capacity of the battery. The preferred thermally sensitive materials change color in response to a temperature change, which change is readily viewable by a consumer. Thus, the consumer, based on the color change, can determine whether the battery is good or needs to be replaced. Examples of such thermally sensitive materials include liquid crystal materials and thermochromic inks. Examples of suitable liquid crystal materials are of the cholesteric type, such as cholesteryl oleate, cholesteryl chloride, cholesteryl caprylate and the like. The indicator material could change from colored to colorless, colorless to colored, or from one color to a second color. A tri-color material could also be used. The preferred battery tester 10 shown in FIGS. 1–8 utilizes an indicating material which changes from colored to colorless upon activation to reveal indicia 23 underneath the indicator material 24.

Indicating materials, such as thermochromic inks, can be used singly or in combination. For example, in one embodiment different layers of the indicating material are employed. The layers are activated at different temperatures or states and can be designed to change different colors at different temperatures. For example, the layer of indicating material activated at the highest temperature will preferably be the bottom layer, i.e., closest to the battery, and the outer layers are arranged in decreasing temperatures of activation with lowest temperature material in the outermost layer, and so, readily viewable at the exterior of the battery.

Either one or both switch segments 60 and 61 of conductive circuit 18 can be out of contact with the respective terminals of the battery so that the tester circuit is open. In one embodiment of the invention, one of the switch segment ends is permanently in electrical connection with one terminal of the battery, while the other switch segment end is positioned out of contact with the other battery terminal. By forcing the switch segment end into contact with the other battery terminal, the switch is closed and the tester circuit is completed to test the battery. The most preferred embodiment is to utilize a dual switch tester as shown in the accompanying drawings.

The labels useful in this invention can also comprise additional electrical and thermal insulative layers, printing layers, protective layers and the like. Suitable materials for use as the different layers are those typically used in battery labels and include plasticized or unplasticized polyvinyl chloride (UPVC), polyesters, metallic films, paper and like. The tester label can be in the form of a shrinkable tube label in which a battery is encased.

Figure 7:
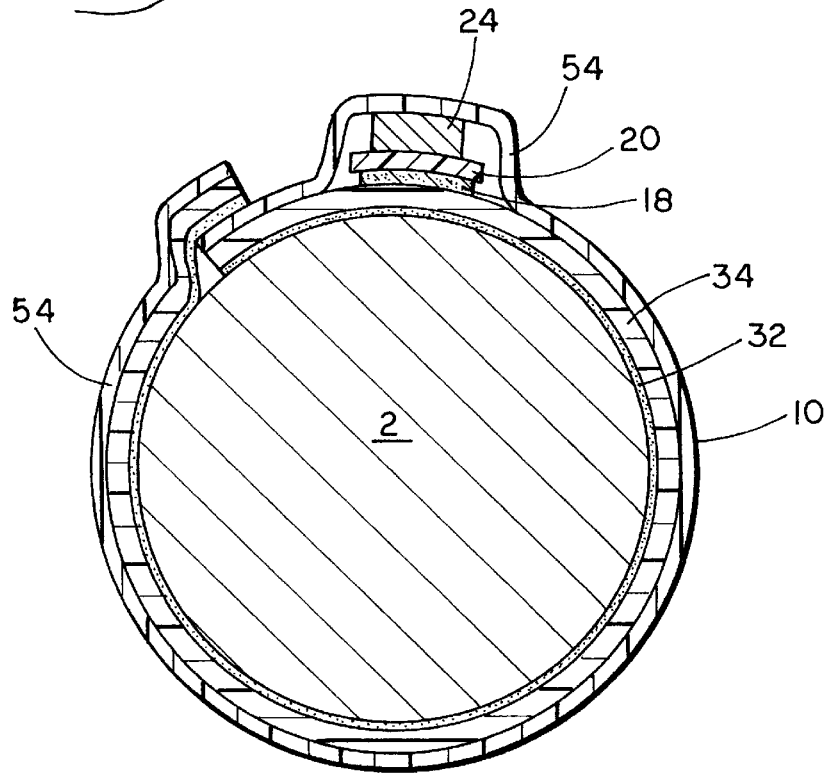
FIG. 7 is a cross section of a battery and the battery tester label.

The battery tester label of the present invention is preferably applied to a battery as follows. A previously assembled inserted tester device 15, having its underside containing pressure-sensitive adhesive 16 exposed, is aligned with a previously formed base layer 30 (disposed upon a releasable liner) such that the electrically conductive circuit 18 of the inserted tester device is positioned to contact the thermal insulation 44 of base layer 30. Upon application of sufficient pressure, the respective layers are secured and joined to one another via pressure-sensitive adhesive 16 disposed on the mating surface of inserted tester device 15. The resulting battery tester label 10 is then attached to the outer periphery of a battery can 2 by removing the liner of base layer 30 to expose adhesive 32 on the underside of label 10 and contacting the underside of base layer 30 to the battery can 2. FIG. 7, not to scale, illustrates a typical cross section of the battery and label assembly 1. It is also possible to produce the tester label of the present invention and apply such to a battery without using preassembled tester device and/or base layer subcomponents. In another embodiment, the battery and tester label assembly is formed by combining the inserted tester device 15 and base layer 30 as previously described. The resulting label is then itself stored, such as on a releasable liner in a wound roll, until needed.

The present invention also enables the production of multiple tester label assemblies. That is, a plurality of tester devices 15 can be aligned and mated with a plurality of base layer components, i.e., regions of thermal insulation, switch throw pads, and switch apertures, disposed upon and defined within a common base layer to form a plurality of battery tester labels 10. The resulting set of multiple label assemblies can then be stored for subsequent use, or separated into smaller groups of multiple label assemblies or into individual battery tester labels.

Figure 9:
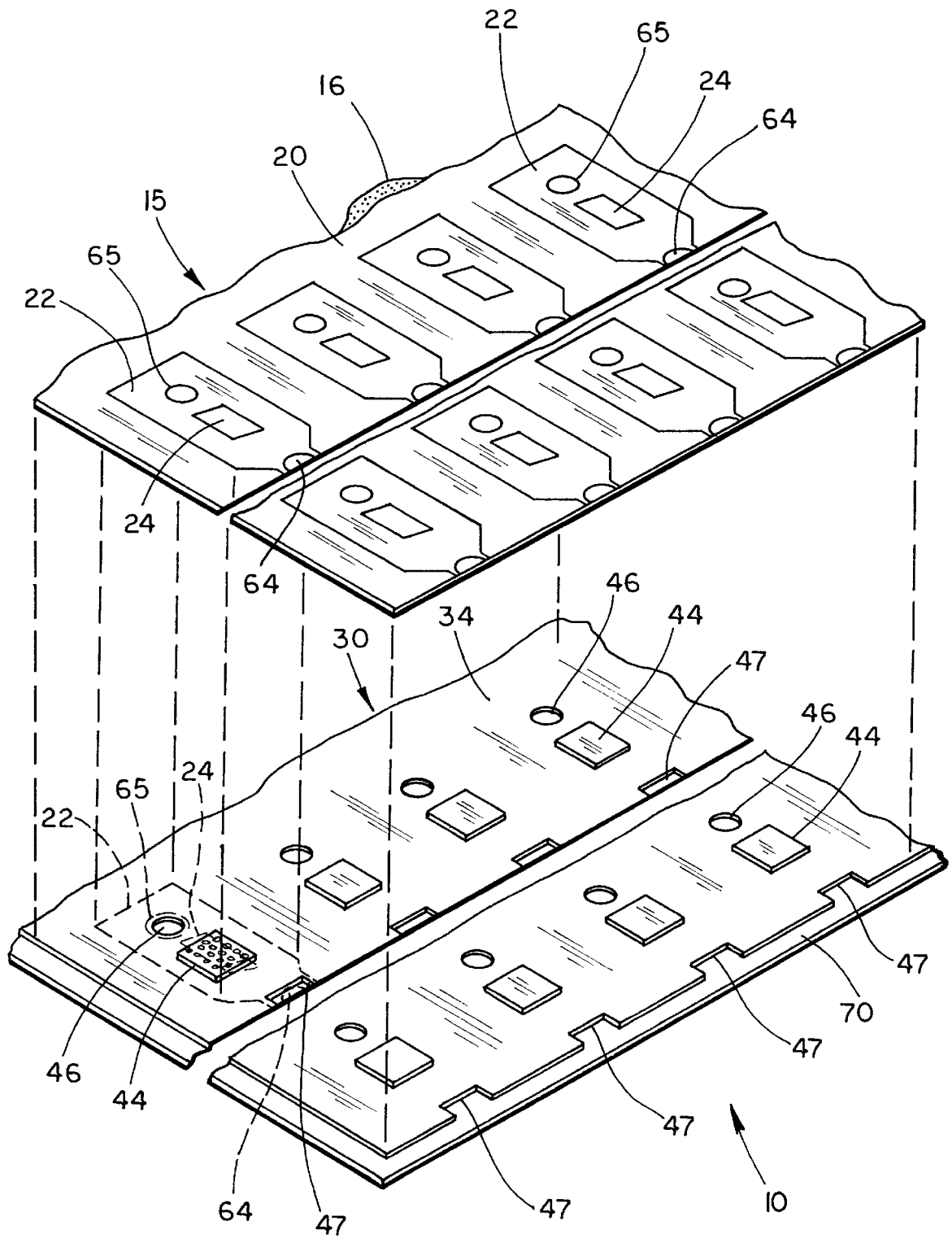
FIG. 9 is an exploded view of a plurality of battery tester labels disposed on a common releasable liner.

In the most preferred embodiment, a series of battery tester labels 10, as illustrated in FIG. 9, are formed on a common releasable liner 70 for subsequent application to batteries. In this most preferred process, an array of tester devices 15 is provided, each tester device formed as previously described and disposed upon a common releasable liner (not shown). A base layer 30 is provided comprising a dielectric substrate 34, a liner 70 that is releasably secured to the underside of the substrate such as by previously noted pressure-sensitive adhesives, and a plurality of regions of thermal insulation 44 disposed on substrate 34. A plurality of apertures 46 and 47 are formed in the base layer through preprinted switch pad 42, in the case of aperture 46. The arrays of base layers and tester devices are then slit into serial rolls. Upon removal of the releasable liner from the serial roll of tester devices, thereby exposing adhesive 16 on the underside of substrate 20, the tester devices 15 are oriented with base layer 30 such that each conductive circuit (not shown) of the tester device roll faces a corresponding region of thermal insulation 44 of the base layer 30, and so that the switch segments of each conductive circuit directly overlie a corresponding pair of apertures 46 and 47 formed in the base layer. The roll of tester devices is then affixed or otherwise secured to the base layer, for instance by adhesive 16, to form a roll of battery tester labels 10 disposed on the common releasable liner 70 residing underneath the base layer.

It is then most preferred to apply a layer of a transparent adhesive and clear film, such as 52 and 54 illustrated in FIG. 2, upon the exposed face of the array of tester devices 15. Upon sufficient curing, if necessary, the resulting coated assembly is die cut so that each individual battery tester label disposed on releasable liner 70 is correctly sized for the battery to receive the tester label. Die cutting is performed so that releasable liner 70 is not cut, so that the tester labels 10 remain on a common sheet to facilitate handling and storage. The excess trimmed label, referred to as the matrix, is then removed.

The present inventors have discovered that methods of the present invention in which two subcomponents are each separately formed and then mated with one another overcome numerous problems otherwise encountered if attempts were made to manufacture a battery tester label in a continuous layering technique, i.e., where each layer is deposited upon the layer before it in a step-wise fashion. For example, the techniques of the present invention avoid problems resulting from material processing mismatches such as the effect of curing a decorative ink layer upon a previously deposited adhesive layer. Additionally, the techniques of the present invention avoid many configurational or structural problems that can occur when depositing material layers or coatings upon previously applied viscous or flowable layers such as some adhesives.

Other assembly variations and materials are disclosed in U.S. Pat. Nos. 5,409,788; 5,393,618; and 5,389,458, each of which is herein incorporated by reference. Additional processing and structural variations are set forth in U.S. Pat. No. 5,223,003, which is herein incorporated by reference.

Of course, it is understood that the foregoing are merely preferred embodiments of the present invention and that various changes and alterations can be made without departing from the spirit and broader aspects thereof as set forth in the appended claims, which are to be interpreted in accordance with the principles of patent law including the doctrine of equivalents.

The embodiments of the invention in which an exclusive property or privilege is claimed are defined as follows:

1. A method for producing a battery tester label, said method comprising:

provided a tester device comprising a dielectric substrate having a conductive circuit layer disposed on a first side of said dielectric substrate, said conductive circuit layer defining first and second switch segments, said tester device further comprising an indicator layer disposed on a second side of said dielectric substrate;

providing a base layer comprising a dielectric substrate and thermal insulation disposed on said substrate;

forming a first aperture in said base layer;

forming a second aperture along a peripheral edge of said base layer;

depositing at least one raised switch throw pad proximate to at least one of said first and second apertures formed in said base layer;

orienting said tester device with said base layer such that said conductive circuit layer of said tester device faces said thermal insulation of said base layer, said first switch segment of said conductive circuit directly overlies said first aperture, and said second switch segment of said conductive circuit directly overlies said second aperture; and affixing said tester device to said base layer to thereby form said battery tester label.

2. The method of claim 1 further comprising applying said battery tester label to a battery having a positive terminal and a negative terminal.

3. The method of claim 2 wherein said first switch segment of said conductive circuit is switchably connected to said positive terminal and said second switch segment of said conductive circuit is switchably connected to said negative terminal.

4. The method of claim 3 wherein a portion of said battery tester label at which said second aperture is formed is folded over an end of said battery so that said second switch segment is switchably connected to said negative terminal.

5. The method of claim 1 wherein said affixing operation comprises depositing adhesive between said tester device and said base layer and engaging said device and said base layer to one another for a time period sufficient for said adhesive to affix said device to said base layer.

6. The method of claim 1 further comprising applying a material onto said battery tester label which provides a transparent protective layer over said tester device.

7. The method of claim 6 wherein said applying said transparent protective layer onto said battery tester label is performed prior to applying said battery tester label to a battery.

8. The battery tester label produced by the method of claim 1.

9. A method for producing a battery tester label comprising an inserted tester device combined with a base layer, said method comprising:

providing a first dielectric substrate;

depositing a conductive circuit on one side of said first substrate, said conductive circuit having first and second switch segments and an area of controlled resistivity;

depositing an indicator layer on a side of said first substrate opposite said conductive circuit, said indicator layer disposed proximate to said area of controlled resistivity of said conductive circuit to thereby form said inserted tester device;

providing a second dielectric substrate;

depositing thermal insulation on at least a portion of a first face of said second substrate to thereby form said base layer;

forming a first aperture in said base layer;

forming a second aperture along a peripheral edge of said base layer;

positioning said inserted tester device with said base layer such that said area of controlled resistivity of said conductive circuit contacts said thermal insulation of said base layer, said first switch segment of said conductive circuit directly overlies said first aperture, and said second switch segment of said conductive circuit directly overlies said second aperture; and affixing said inserted tester device to said base layer to thereby form said battery tester label.

10. The method as set forth in claim 9 which further comprises the step of depositing at least one raised switch throw pad proximate to at least one of said first and second apertures formed in said base layer.

11. The method of claim 10 further comprising applying said battery tester label to a battery having a positive terminal and a negative terminal.

12. The method of claim 11 wherein said first switch segment of said conductive circuit is switchably connected to said positive terminal and said second switch segment of said conductive circuit is switchably connected to said negative terminal.

13. The method of claim 12 wherein a portion of said battery tester label at which said second aperture is formed is folded over and secured to an end of said battery so that said second switch segment is switchably connected to said negative terminal.

14. The method of claim 9 wherein said affixing operation comprises depositing adhesive between said inserted tester device and said base layer and engaging said device and said base layer to one another for a time period sufficient for said adhesive to affix said device to said base layer.

15. The method of claim 9 further comprising printing graphic indicia on said first dielectric substrate prior to depositing said indicator layer, wherein said indicator layer is deposited upon and generally covering said graphic indicia.

16. The method of claim 9 further comprising printing decorative layers on said first substrate forming said inserted tester device.

17. The method of claim 9 further comprising depositing a layer of adhesive on at least a portion of said one side of said first substrate.

18. The method of claim 17 wherein said adhesive is a pressure-sensitive adhesive.

19. The method of claim 9 further comprising:

depositing a metallization layer on said first face of said second substrate; and providing electrical insulation between said metallization layer and said conductive circuit.

20. The method of claim 9 further comprising depositing a layer of adhesive on a second face of said second substrate opposite said first face having said thermal insulation.

21. The method of claim 20 wherein said adhesive is a pressure-sensitive adhesive.

22. The battery tester label produced by the method of claim 9.

23. A process for manufacturing a battery tester label comprising an inserted tester device and a base layer, and applying said label to a battery having a positive terminal and a negative terminal, said process comprising:

providing a first dielectric substrate;

depositing a metallization layer on a first face of said first dielectric substrate;

depositing a primer material on said metallization layer;

depositing at least one layer of a decorative coloring material and an electrical insulation material on said primer material;

applying thermal insulation on at least a portion of said first face of said first dielectric substrate; and depositing a first raised switch throw pad upon said first face of said first dielectric substrate and further depositing a second raised switch throw pad along a peripheral edge of said first dielectric substrate, to thereby form said base layer;

providing a second dielectric substrate;

forming an elongated conductive circuit on a first face of said second dielectric substrate, said conductive circuit having distal first and second switch segments and a medially disposed area of controlled resistivity between said switch segments and in electrical contact with said switch segments;

depositing indicia on a second face of said second dielectric substrate, in a region generally disposed adjacent said area of controlled resistivity;

depositing an indicator layer on said second face of said second dielectric substrate and over said indicia, to thereby form said inserted tester device;

forming an aperture in said base layer proximate to said first raised switch throw pad and forming a notch along said peripheral edge of said base layer proximate to said second raised switch throw pad;

positioning said inserted tester device with said base layer such that said area of controlled resistivity of said conductive circuit is adjacent and faces said thermal insulation of said base layer, said first switch segment of said conductive circuit overlies said aperture in said base layer and said second switch segment of said conductive circuit overlies said notch in said base layer;

affixing said inserted tester device to said base layer to thereby form said battery tester label; and applying said battery tester label to said battery so that said first switch segment of said conductive circuit is switchably connected to said positive terminal through said aperture and said second switch segment of said conductive circuit is switchably connected to said negative terminal through said notch.

24. The battery and tester label produced by the method of claim 23.

25. A method for producing a plurality of battery tester labels disposed on a common releasable liner, said method comprising:

providing a plurality of tester devices disposed on a first substrate, each said tester device comprising a conductive circuit layer disposed on a first side of said first substrate, said conductive circuit layer defining first and second switch segments, each said tester device further comprising an indicator layer disposed on a second side of said first substrate;

providing a base layer comprising a second substrate, a liner releasably secured to a first face of said second substrate, and a plurality of regions of thermal insulation disposed on a second face of said second substrate;

forming a plurality of first apertures in said base layer;

forming a plurality of second apertures in said base layer;

orienting said plurality of tester devices with said base layer such that said conductive circuit layer of each said tester device faces a corresponding region of thermal insulation, said first switch segment of each said conductive circuit directly overlies a corresponding first aperture, and said second switch segment of each said conductive circuit directly overlies a corresponding second aperture; and affixing said plurality of tester devices to said base layer to thereby form said plurality of battery tester labels.

26. The method of claim 25 further comprising:

cutting said first substrate, said second substrate, and said liner to separate said plurality of battery tester labels into smaller groups of battery tester labels.

27. The method of claim 26 wherein at least one of said smaller groups of battery tester labels is disposed on a relatively long strip of said releasable liner.

28. The method of claim 25 further comprising:

applying a transparent protective layer on said second side of said first substrate.

29. The method of claim 28 wherein said protective layer is applied after said affixing step, and said protective layer is applied onto at least a majority of said second side of said first substrate.

30. The method of claim 25 further comprising:

die cutting said plurality of battery tester labels; and removing excess trimmed material from said liner.

31. The plurality of battery tester labels disposed on a common releasable liner produced by the method of claim 25.

32. A method for producing a battery tester label, said method comprising the steps of:

providing a base layer having a first dielectric substrate with a first adhesive layer on one side thereof for subsequent adhesion to the battery and a first release layer overlying said first adhesive layer;

forming at least a first switch aperture in said base layer;

providing a tester device having a second dielectric substrate, said second substrate having a conductive circuit on one side thereof, a second adhesive layer for subsequent adhesion to the other side of said base layer over at least certain areas of said one side thereof and a second release layer overlying said second adhesive layer, said circuit having an area of controlled resistivity and at least one switch segment;

applying a thermal indicator layer on the other side of said second dielectric substrate;

removing the second release layer from said second dielectric substrate;

adhering the first side of said second dielectric substrate to the other side of said base layer with said switch segment overlying said switch aperture.

* * * * *